United States Patent [19]

Pankove

[11] 4,109,271
[45] Aug. 22, 1978

[54] AMORPHOUS SILICON-AMORPHOUS SILICON CARBIDE PHOTOVOLTAIC DEVICE

[75] Inventor: Jacques Isaac Pankove, Princeton, N.J.

[73] Assignee: RCA Corporation, New York, N.Y.

[21] Appl. No.: 801,239

[22] Filed: May 27, 1977

[51] Int. Cl.$^2$ .......................................... H01L 27/14
[52] U.S. Cl. ...................................... 357/30; 357/16; 357/58
[58] Field of Search ........................... 357/30, 58, 16

[56] References Cited

U.S. PATENT DOCUMENTS

| 3,982,262 | 9/1976 | Karatsjuba | 357/17 |
| 4,064,521 | 12/1977 | Carlson | 357/2 |

Primary Examiner—Martin H. Edlow
Attorney, Agent, or Firm—H. Christoffersen; B. E. Morris; A. Stephen Zavell

[57] ABSTRACT

A layer of amorphous silicon-carbide prepared by a glow discharge in a mixture of silane, hydrocarbon and doping gases is at the solar radiation incident surface of a photovoltaic device. The photovoltaic device includes first and second contiguous layers of amorphous silicon fabricated by a glow discharge in silane. The amorphous silicon carbide layer is contiguous to the second layer and opposite the first layer. The amorphous silicon carbide layer is substantially transparent to solar radiation and highly conductive, providing increased solar radiation collection efficiency and reduced internal resistance.

13 Claims, 2 Drawing Figures

AMORPHOUS SILICON-AMORPHOUS SILICON CARBIDE PHOTOVOLTAIC DEVICE

BACKGROUND OF THE INVENTION

The present invention relates to photovoltaic devices and more particularly to an amorphous silicon-amorphous silicon carbide photovoltaic device.

Alternative methods of generating electrical power have recently received much publicity. Photovoltaic devices, and in particular solar cells, have been considered as a means for fulfilling at least a portion of the nation's growing energy needs. Solar cells are devices which are capable of converting solar radiation into usable electrical energy. Photovoltaic devices prepared by a glow discharge in silane have recently met with success in generating inexpensive electrical energy from sunlight. Such devices are taught in U.S. application Ser. No. 710,183, entitled "A Semiconductor Device Having A Body of Amorphous Silicon and Method of Making the Same" by David E. Carlson. Some of these devices have been found to have surface states which function as efficient recombination centers at layer interfaces. As a result of these recombination centers, carriers generated near these interfaces of the solar cell often disappear before reaching the high field region of the solar cell, and thus cannot be collected as current. Furthermore, in Schottky barrier amorphous silicon cells, in order to reduce the internal resistance of the solar cell, the metallic conducting layer at the incident surface should be thick. However, increasing the thickness of this surface layer reduces the amount of light penetrating the device, consequently decreasing its photovoltaic efficiency. Therefore, it would be most desirable in the field of amorphous silicon photovoltaic devices if the aforementioned problems could be overcome.

SUMMARY OF THE INVENTION

A photovoltaic semiconductor device includes a first layer of amorphous silicon prepared by a glow discharge in silane and a doping gas contiguous to a second layer of amorphous silicon prepared by a glow discharge in silane, and a third layer of amorphous silicon carbide prepared by a glow discharge in a mixture of silane and a hydrocarbon and doping gases contiguous to the second layer and spaced opposite the first layer. The first layer is of one conductivity type while the third layer is of an opposite conductivity type. The second layer is substantially intrinsic. The third layer has an incident surface opposite the second layer on which solar radiation is capable of impinging. The bandgap energy of the third layer is in the range of about 2.2 eV to 3.2 eV. An electrically conductive substrate is contiguous to the first layer, and there is a means for electrically contacting the third layer.

DETAILED DESCRIPTION OF THE INVENTION

Figure 1:
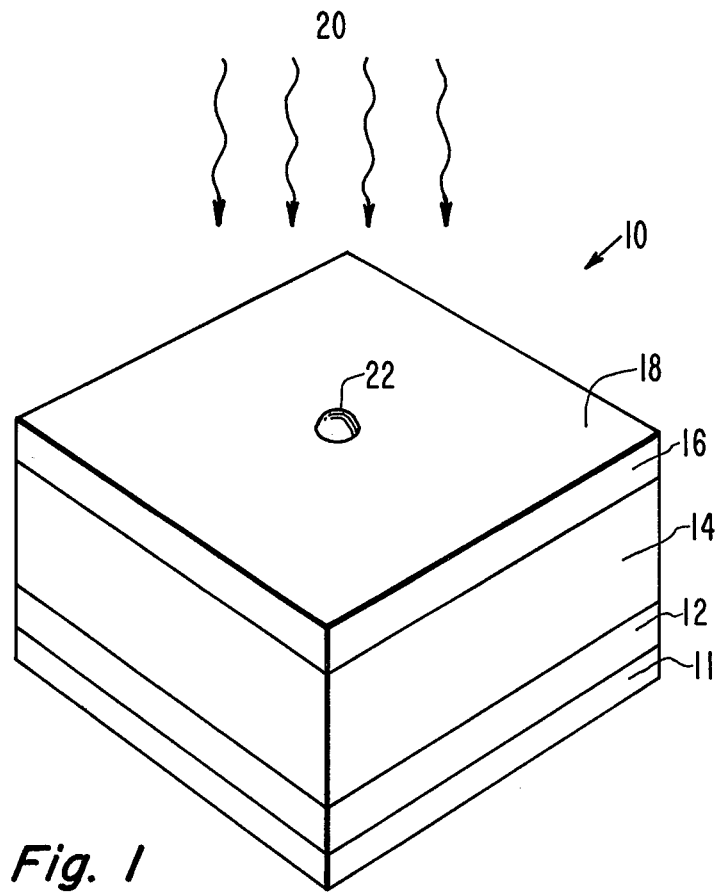
FIG. 1 is a perspective view of the photovoltaic device of the present invention.

Referring to FIG. 1, the photovoltaic semiconductor device of the present invention is designated as 10. While the photovoltaic device 10 is described as a PIN solar cell, it is anticipated by the present invention that it could have other photovoltaic applications, such as a photodetector. The solar cell 10 includes an electrically conductive substrate 11. Materials suitable for the conductive substrate 11 include aluminum, chromium, tantalum, antimony, niobium, tungsten or stainless steel. On a surface of conductive substrate 11 and in electrical contact with the substrate 11 is a first layer 12 of amorphous silicon prepared by a glow discharge in silane ($SiH_4$) and a doping gas. A second layer 14 of amorphous silicon prepared by a glow discharge in silane is contiguous to the first layer 12 and a third layer 16 of amorphous silicon carbide prepared by a glow discharge in a mixture of silane, a hydrocarbon and doping gases is contiguous to the second layer 14 and spaced opposite from the first layer 12. The first layer 12 is of one conductivity type, either P- or N-type, and the third layer 16 is of the opposite conductivity type. For purposes of describing the solar cell 10, the first layer 12 is of a P-type conductivity and the third layer 16 is of N-type conductivity. Both the first and third layers 12 and 16 are highly conductive, each having a dopant concentration on the order of $10^{19}/cm^3$. The second layer 14 is substantially intrinsic in conductivity and is typically undoped. However, it has been discovered that undoped amorphous silicon prepared by a glow discharge in silane is usually slightly N-type. The third layer 16 has an incident surface 18, opposite the second layer 14, on which solar radiation is capable of impinging. Impinging solar radiation is designated as 20.

The amorphous silicon carbide of the third layer 16 has a bandgap energy in the range of about 2.2 eV to 3.2 eV. As is well known to those skilled in the art, the bandgap energy of the amorphous silicon carbide is dependent on certain fabrication parameters such as choice of deposition gases, temperature of the deposition substrate and the ratio of the deposition gas pressures (more details of which are given below). The bandgap energy of a semiconductor material determines the solar radiation absorption capabilities of the semiconductor material. For example, if the amorphous silicon carbide of the third layer 16 has a bandgap energy of about 2.5 eV, photons of solar radiation with an energy of 2.5 eV or greater will be absorbed while photons of an energy level less than 2.5 eV will not be absorbed. Thus, the relatively wide bandgap of the amorphous silicon carbide transmits most of the useful solar spectrum to the first and second layers 12 and 14 of amorphous silicon. Amorphous silicon has a bandgap energy of approximately 1.6 eV and is thus far more absorbing of the solar radiation spectrum than the amorphous silicon carbide. The third layer 16 can typically be of a thickness on the order of 0.5 micron and still be substantially transparent to solar radiation. This feature of the present invention, i.e., a relatively thick layer at the incident surface that is substantially transparent, cannot be accomplished by many prior art amorphous solar cell devices, particularly of the Schottky barrier type. Generally, the thicker the third layer 16, the less internal resistance there is in the cell 10. This relatively large thickness of layer 16 provides the present invention with a low internal resistance as compared to other solar cells.

On the incident surface 18 are means for electrically contacting the third layer 16. Since the third layer 16 is highly conductive, the means for electrically contacting it need occupy only a small area of the incident surface 18. Specifically, a dot electrode 22 is shown in FIG. 1 as a means of electrically contacting the third layer 16. However, other contacting means well known to those skilled in the art could also be used, such as a contact extending along the periphery of the incident surface 18.

An amorphous material is one which has no long range order in the periodicity of its constituent atoms. The lack of long range order of an amorphous silicon material or an amorphous silicon carbide can be detected by X-ray or electron diffraction methods.

The amorphous silicon of the first and second layers 12 and 14 fabricated by a glow discharge in silane, possesses characteristics ideally suited for solar cell application. Electron lifetime in amorphous silicon fabricated by a glow discharge in silane can be on the order of $10^{-7}$ seconds or greater, while electron lifetime in amorphous silicon fabricated by sputtering or evaporation is in the order of $10^{-11}$ seconds.

Also, measurements of the spectral response of devices as taught in application Ser. No. 710,183 indicate a high collection efficiency through the visible portion of the spectrum, e.g., the average collection efficiency in the spectral range of 4,000Å to 7,000Å is on the order of 50%. Since the absorption coefficient of glow discharge amorphous silicon is rather high, only a relatively thin layer of amorphous silicon is needed for sufficient solar radiation absorption. Typically, the second layer 14 of amorphous silicon is about 1 micron or less in thickness while the first layer 12 is typically a few hundred angstroms in thickness.

Furthermore, the average density of localized states in the energy gap of glow discharge amorphous silicon is on the order of $10^{17}/cm^3$ or less. The average density of localized states of glow discharge amorphous silicon decreases with increasing deposition temperatures up to about 350° C. and increasing purity of the silane in the fabrication of the amorphous silicon. It is known that the glow discharge process introduces hydrogen into the amorphous silicon. The hydrogen is understood to be important in providing the good electrical properties of the amorphous material, by occupying what, in the absence of hydrogen, would have been a dangling bonds. Dangling bonds, such as found at surfaces of crystals or in vacancies are well known to greatly reduce carrier lifetime. Significant about the average density of localized states in the energy gap is that it is inversely proportional to the square of the width of the depletion region. Since glow discharge amorphous silicon's density of states is relatively low, a depletion width on the order of 1 micron can be obtained.

Well known to those in the PIN solar cell art is that as a result of the equalization of Fermi levels between the first, second and third layers 12, 14 and 16 there is a negative space charge in the third layer 16, and a positive space charge in the first layer 12, and the formation of a built-in potential between the first and second layers 12 and 14, and the third and second layers 16 and 14, and also the formation of a depletion region in the second layer 14. How far the electric field of the depletion region extends into the second layer 14 is a function of the average density of localized states in the energy gap, as previously explained, and the magnitude of the built-in potential. Also, from the earlier discussion of the average density of localized states, it is foreseen that the depletion region can extend across the entire thickness of the second layer 14, i.e., about 1 micron or less in thickness, as long as the built-in potential is sufficiently high. Therefore, any carrier generated in the second layer 14 by the absorption of solar radiation 20, will be swept into the electric field of the depletion region and be collected as electrical current.

The dopant concentration, i.e., the conductivity modifier, of the third layer 16 of amorphous silicon carbide may be uniform throughout, and typically is on the order of $10^{19}/cm^3$.

Preferably, the carbon concentration, i.e., the carbon element of the silicon-carbide, of the third layer 16 is graded such that the concentration of carbon is a maximum at the incident surface 18, i.e., about 50 to 70 atomic percent and decreases to about zero atomic percent at the interface of the third layer 16 and second layer 14. A graded carbon concentration in the third layer 16 generates an electric field acting on minority carriers within the third layer 16. Therefore, with the depletion region in the second layer 14 and a graded carbon concentration in the third layer 16, an electric field extends essentially through both the second and third layers 14 and 16. In the second layer 14 the electric field drives both electrons and holes, whereas in the third layer 16 the electric field drifts only the minority carriers.

In the operation of the photovoltaic device 10 of the present invention, solar radiation 20 which impinges the incident surface 18 is most likely to be absorbed by the second layer 14 generating electron-hole pairs therein. The photogenerated carriers in the second layer 14 will be swept by the electric field in the depletion region and be collected as electrical current at the conductive substrate 11 and at the third layer 16. While the third layer 16 is substantially transparent to solar radiation, some solar radiation will still be absorbed in the third layer 16. If the third layer has a graded carbon concentration, those photogenerated carriers which are minority carriers in the third layer 14 will also be swept by the electric field in the third layer 16 and collected as usable current.

In prior art PIN solar cells, many of the photogenerated carriers disappear by recombination before they reach the high electric field region of the cell, and are thus not collected as usable current. However, in the present invention, since the third layer 16 of amorphous silicon carbide can be fabricated on the second layer 14 without interrupting the glow discharge process, no surface states are formed at the interface of the second and third layers 14 and 16. These surface states would have acted as recombination centers. Hence, all the carriers generated near the interface of the second and third layers 14 and 16 are drifted by the high electric field of the second layer 14. Therefore, the amorphous silicon carbide of the third layer 16 improves carrier collection efficiency.

Figure 2:
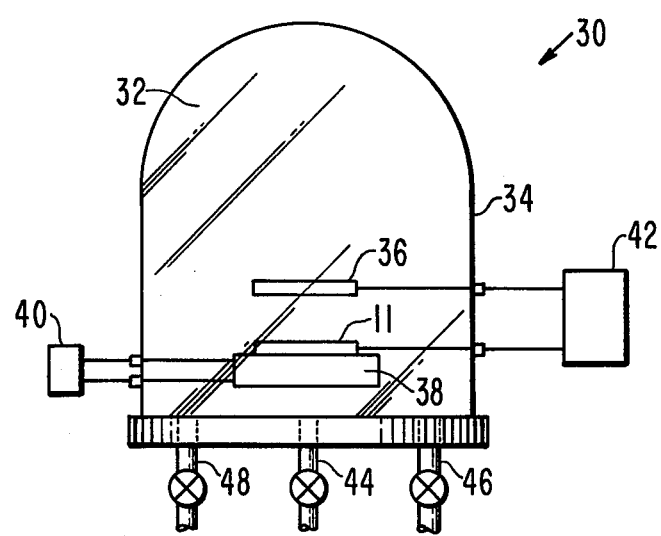
FIG. 2 is a schematic view of an apparatus for carrying out the fabrication of the photovoltaic device of FIG. 1.

Referring to FIG. 2, a glow discharge apparatus suitable for carrying out the fabrication of the photovoltaic device 10 of the present invention is generally designated as 30. The glow discharge apparatus 30 includes a vacuum chamber 32 defined by a vacuum bell jar 34, typically of a glass material. In the vacuum chamber 32 is an electrode 36, and a heating plate 38 spaced from and opposite the electrode 36. The electrode 36 is of a metallic material having good electrical conductivity such as platinum and is in the form of a screen or coil. The heating plate 38 is a ceramic frame which encloses heating coils which are energized from current source 40, external from the vacuum chamber 32.

A first outlet 44 into the vacuum chamber 32 is connected to a diffusion pump, a second outlet 46 is connected to a mechanical pump, and a third outlet 48 is connected to a gas bleed-in system which is a source of the various gases utilized in the glow discharge process. While the second outlet 46 is described as being connected to a diffusion pump, it is anticipated that the diffusion pump may not be necessary since the mechanical pump connected to the first outlet 44 may evacuate the system to a sufficient pressure.

In the fabrication of the photovoltaic device 10, the substrate 11, e.g., stainless steel, is placed on the heating plate 38 and the substrate 11 is connected to one terminal of a power source 42 and the electrode 36 is connected to an opposite terminal of the power source 42. A voltage potential therefore exists between the electrode 36 and substrate 11. The power source 42 can be either D.C. or it can be A.C., i.e., in the low frequency range for example 60 Hertz, or it can be RF, i.e., in the high frequency range, for example on the order of 20 megahertz. Typically, when the power source 42 is D.C., the electrode 36 is connected to the positive terminal of the power source 42 and the substrate 11 is connected to the negative terminal of the power source 42. Thus, the electrode 36 functions as an anode and the substrate 11 functions as a cathode when the power source 42 is energized. This is referred to as the D.C. cathodic mode of operation. However, in a D.C. operation substrate 11 and electrode 36 can be of the opposite polarities described, i.e., the substrate 11 is the anode and the electrode 36 is the cathode, which is referred to as the D.C. anodic mode of operation. It has been discovered that the deposition rates are somewhat higher in the cathodic mode than in the anodic mode.

Next, silane, $SiH_4$, and diborane, as the doping gas, are bled into the vacuum chamber 32 so that the diborane constitutes 0.5 to 5.0 percent of the silane-diborane atmosphere. The vacuum chamber 32 is at a pressure of 0.1 to 1.0 torr and the substrate 11 is heated to a temperature in the range of 200° C. to 500° C. If it were desired that the first layer 12 be of N-type conductivity the doping gas could be phosphine, where the phosphine constitutes 0.1 to 1.0 percent of the silane-phosphine atmosphere.

To initiate the glow discharge between the electrode 36 and the substrate 11, the power source 42 is energized resulting in the deposition of the first layer 12. The current density between the electrode 36 and substrate 11 should be in the range of 0.3 to 3.0 ma/cm$^2$ at the surface of the substrate 11. The deposition rate of the amorphous silicon increases with the vapor pressure of the silane and doping gas and the current density.

The atmosphere in the vacuum chamber 32 is then pumped out by the mechanical pump 46. With the vacuum chamber 32 at a pressure of about $10^{-6}$ torr, silane is bled into the vacuum chamber 32 at a pressure of 0.1 to 5.0 torr. Again, a glow discharge is initiated for 1 to 5 minutes with the current density of from 0.5 ma/cm$^2$ to 3.0 ma/cm$^2$ at the surface of the first layer 12 for the deposition of the second layer 14 of about 1 micron in thickness.

Next, a hydrocarbon gas such as methane ($CH_4$) or ethylene ($C_2H_4$) and a doping gas, such as ammonia ($NH_3$) or nitrogen, are bled into the vacuum chamber 32. When methane ($CH_4$) is used, its partial pressure in chamber 32 is about ten times larger than the partial pressure of silane; whereas, if ethylene ($C_2H_4$) is used, its partial pressure is about twice that of silane. For example, the methane can be at a pressure of about 1.0 torr while the silane is at a pressure of about 0.1 torr. A glow discharge is initiated with a current density of from 0.3 ma/cm$^2$ to 3.0 ma/cm$^2$ at the surface of the second layer 14 and the N-type third layer 16 is deposited thereon. The third layer 16, deposited under these processing conditions, has a bandgap energy of about 2.5 eV. If the third layer 16 were to be of P-type conductivity, the deposition gases could be a mixture of silane, ethylene and trimethyl aluminum. If grading the carbon concentration is desired, the amount of hydrocarbon gas bled into the vacuum chamber 32 is increased during the glow discharge process to attain the desired grading.

The electrical contact dot 22 is then deposited on the incident surface 18 of the third layer 16 by state of the art evaporation techniques. Fianl fabrication of the photovoltaic device 10 includes connecting contacting wires (not shown) to the conducting substrate 11 and electrical contact dot 22 for electrical connection to external circuitry.

In the photovoltaic device of the present invention, the layer of amorphous silicon carbide fabricated by a glow discharge in silane, a hydrocarbon and doping gases provides the device with improved carrier collection efficiency and reduced internal resistance.

I claim:

1. A photovoltaic semiconductor device comprising:
   a first layer of amorphous silicon prepared by a glow discharge in silane and a doping gas, said first layer being of one conductivity type:
   a second layer of amorphous silicon prepared by a glow discharge in silane contiguous to said first layer, said second layer being substantially intrinsic;
   a third layer of amorphous silicon carbide prepared by a glow discharge in a mixture of silane, a hydrocarbon and doping gases contiguous to said second layer and spaced opposite said first layer, said third layer having an incident surface opposite said second layer on which solar radiation is capable of impinging, said third layer being of a conductivity type opposite that of said first layer and having a bandgap energy in the range of about 2.2 eV to 3.2 eV;
   a substrate contiguous to and electrically contacting said first layer; and
   means for electrically contacting said third layer.

2. The photovoltaic semiconductor device in accordance with claim 1 wherein said third layer has a graded carbon concentration which is a maximum at said incident surface and decreases toward the interface with said second layer.

3. The photovoltaic semiconductor device in accordance with claim 2 wherein said maximum carbon concentration is about 50 to 70 atomic percent and decreases to about zero atomic percent at the interface of said second layer.

4. The photovoltaic semiconductor device in accordance with claim 1 wherein said third layer has a uniform dopant concentration.

5. The photovoltaic semiconductor device in accordance with claim 4 wherein said dopant concentration is about $10^{19}$/cm$^3$.

6. The photovoltaic device in accordance with claim 1 wherein said means for electrically contacting said third layer is a dot electrode on said incident surface.

7. The photovoltaic device in accordance with claim 1 wherein said third layer has a thickness of about 0.5 micron.

8. The photovoltaic device in accordance with claim 7 wherein said second layer has a thickness of 1.0 micron or less and said first layer has a thickness of a few hundred angstroms.

9. The photovoltaic semiconductor device in accordance with claim 1 wherein said first layer is of P-type conductivity and said third layer is of N-type conductivity.

10. The photovoltaic semiconductor device in accordance with claim 1 wherein said first layer is of N-type conductivity and said third layer is of P-type conductivity.

11. The photovoltaic semiconductor device in accordance with claim 1 wherein said hydrocarbon is methane.

12. The photovoltaic semiconductor device in accordance with claim 1 wherein said hydrocarbon is ethylene.

13. The photovoltaic semiconductor device in accordance with claim 1 wherein said doping gas of said third layer is ammonia.

* * * * *